US008405383B2

(12) United States Patent
Agrawal et al.

(10) Patent No.: US 8,405,383 B2
(45) Date of Patent: Mar. 26, 2013

(54) THREE-PHASE SELECTABLE ENERGY METER

(75) Inventors: Sachin Agrawal, Sitapur (IN);
Christian David Hack, Wavell Heights (AU); David Anthony Wilson, Richmond (AU)

(73) Assignee: General Electric Company, Schenectady, NY (US)

( * ) Notice: Subject to any disclaimer, the term of this patent is extended or adjusted under 35 U.S.C. 154(b) by 59 days.

(21) Appl. No.: 13/047,459

(22) Filed: Mar. 14, 2011

(65) Prior Publication Data

US 2012/0235667 A1 Sep. 20, 2012

(51) Int. Cl.
*G01R 11/32* (2006.01)
*H02B 1/26* (2006.01)

(52) U.S. Cl. ........................ 324/142; 361/641

(58) Field of Classification Search .................. 324/115, 324/103 R, 103 P, 114, 137–143, 764.01, 324/765.01; 702/57–60; 361/662–672
See application file for complete search history.

(56) References Cited

U.S. PATENT DOCUMENTS

| | | | | |
|---|---|---|---|---|
| 3,909,900 A * | 10/1975 | Gudmestad | .................. | 29/564.4 |
| 4,023,101 A | 5/1977 | Christoffer | | |
| 6,937,003 B2 * | 8/2005 | Bowman et al. | .......... | 324/117 R |
| 7,012,446 B2 * | 3/2006 | Taguchi et al. | ........... | 324/117 R |
| 7,538,540 B2 * | 5/2009 | Tsukamoto | ............... | 324/117 R |
| 7,551,425 B2 * | 6/2009 | Byrne | .......................... | 361/622 |
| 7,693,670 B2 | 4/2010 | Durling et al. | | |
| 8,185,333 B2 * | 5/2012 | Jonsson et al. | .................. | 702/66 |
| 8,212,548 B2 * | 7/2012 | Parker et al. | ............. | 324/140 R |
| 8,233,569 B2 * | 7/2012 | Tan et al. | ....................... | 375/339 |
| 8,269,480 B2 * | 9/2012 | Max et al. | .................. | 324/76.11 |
| 8,294,453 B2 * | 10/2012 | Bowman | ....................... | 324/127 |
| 2007/0205663 A1 | 9/2007 | Byrne | | |

FOREIGN PATENT DOCUMENTS

| | | |
|---|---|---|
| CN | 2147542 Y | 11/1993 |
| CN | 201060252 Y | 5/2008 |
| DE | 3622771 A1 | 1/1988 |
| DE | 42 02 655 A1 | 8/1993 |
| GB | 346640 A | 4/1931 |
| JP | 4-128658 A | 4/1992 |
| JP | 2006-84374 A | 3/2006 |

OTHER PUBLICATIONS

Howarth, "The Metering of Three-Phase Supplies", IEE Meter and Instrument Section, Dec. 5, 1930, p. 381-393.*
Moore, Planning the Future Electricity Meter, IEE Measurements Section, Aug. 1944, p. 107-115.*
Larsen and Toubro, Three-Phase Energy Meter-EM301, Larsen & Toubro Ltd., Meter and Protection Systems, www.intmps.com, p. 1-2.*

(Continued)

*Primary Examiner* — Joshua Benitez Rosario
(74) *Attorney, Agent, or Firm* — Hoffman Warnick LLC; William Heinze

(57) ABSTRACT

A three-phase selection energy meter is disclosed. In one embodiment, an energy meter includes a base; a phase A terminal barrel, a phase B terminal barrel and a phase C terminal barrel; and a phase selection member movably engaged with the base, the phase selection member permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel.

6 Claims, 4 Drawing Sheets

OTHER PUBLICATIONS

Anonymous, "EPM 5200/5300/5350 Power Metering System, Multi-Function Meter with Power Quality Instruction Manual", 2007, pp. 1-31. XP002679034, Retrieved from the Internet: URL:http///www.gedigitalenergy.com/Products/manuals/epm/GEK-1065578.pdf, GE Multilin, Ontario, Canada.

Search Report issued in connection with EP Application No. 12158303.3, Jul. 13, 2012.

Office Action issued in connection with NZ Patent Application No. 598768, Mar. 19, 2012.

* cited by examiner

THREE-PHASE SELECTABLE ENERGY METER

BACKGROUND OF THE INVENTION

The subject matter disclosed herein relates to a three-phase selectable energy meter. Specifically, the subject matter disclosed herein relates to an energy meter allowing for selection between three phases of power supply.

In electrical energy distribution networks utilizing three-phase systems, unbalanced loads (e.g., loads carried unevenly across the three phases), may negatively impact performance. Conventionally, e.g., residential power supply is provided using only a single phase, with every third household along the network each receiving power from one of the three phases. This general approximation may average out across the grid, thereby providing substantially uniform load distribution across each of the three phases.

Recently, energy utilities have requested the ability to control secondary (or, "non-essential") load devices in order to meet target service requirements during times of high demand. Some larger buildings (e.g., large residential buildings, office buildings, etc.) may require three-phase power for devices requiring relatively large power loads (e.g., air conditioning systems). In these cases, the secondary, or non-essential, loads are restricted to a single phase of the three phases.

In order to ensure that secondary loads are evenly allocated across the three-phase network, meter installers (e.g., human technicians) conventionally carry three different varieties of three-phase meter. Each variety is configured to engage one phase when installed. However, manufacturing three varieties of three-phase meter may be costly, and carrying these three varieties of a three-phase meter may cause the technician to amass an unwieldy inventory of devices.

BRIEF DESCRIPTION OF THE INVENTION

A three-phase selectable energy meter is disclosed. In one embodiment, the three-phase selectable energy meter includes a base; a phase A terminal barrel, a phase B terminal barrel and a phase C terminal barrel; and a phase selection member movably engaged with the base, the phase selection member permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel.

A first aspect of the invention includes an energy meter having: a base; a phase A terminal barrel, a phase B terminal barrel and a phase C terminal barrel; and a phase selection member movably engaged with the base, the phase selection member permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel.

A second aspect of the invention includes a three-phase selectable energy meter having: a base housing a phase A terminal barrel, a phase B terminal barrel and a phase C terminal barrel; a phase selection member movably engaged with the base, the phase selection member permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel; and an actuation member engaged with the phase selection member and only one of the phase A terminal barrel, the phase B terminal barrel and the phase C terminal barrel.

A third aspect of the invention includes a three-phase selectable energy meter having: a base housing: a phase A terminal barrel, a phase B terminal barrel and a phase C terminal barrel; and a relay; and a phase selection member including a connecting strip electrically connected to the relay, the phase selection member being movably engaged with the base and permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
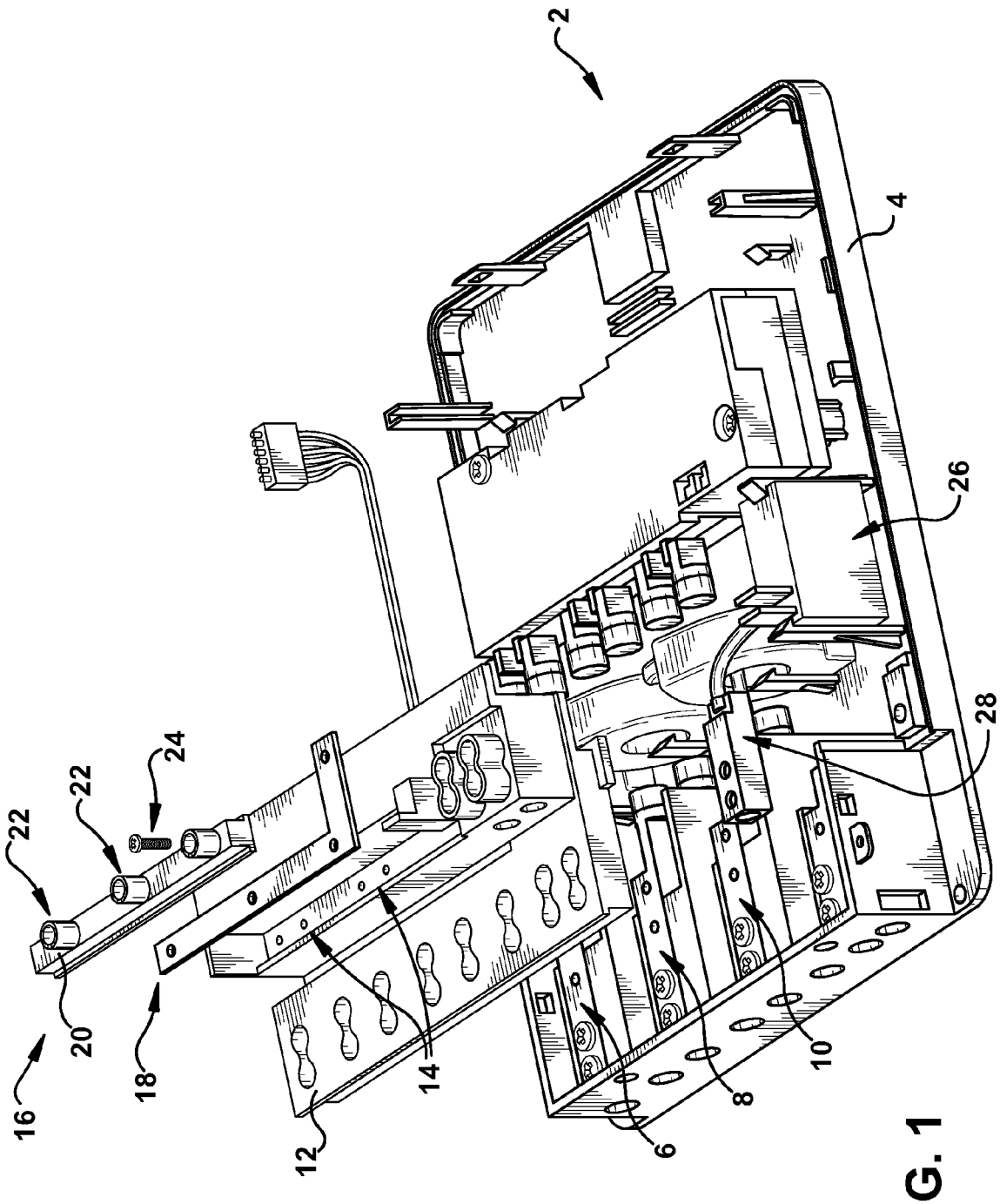
FIG. 1 shows a partial blow-out three-dimensional perspective view of a portion of a three-phase selectable energy meter according to embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Aspects of the invention relate to a three-phase selection energy meter. Specifically, the subject matter disclosed herein relates to an energy meter allowing for selection between three phases of power supply.

As noted herein, recently, energy utilities are requesting the ability to control secondary (or, "non-essential") load devices in order to meet target service requirements during times of high demand. Some larger buildings (e.g., large residential buildings, office buildings, etc.) may require three-phase power for devices requiring relatively large power loads (e.g., air conditioning systems). In these cases, the secondary, or non-essential, loads are restricted to a single phase of the three phases.

In order to ensure that secondary loads are evenly allocated across the three-phase network, meter installers (e.g., human technicians) conventionally carry three different varieties of three-phase meter. When the utility aims to reduce the single phase load on one of the three-phase meters, it may be desirable to reduce the load applied evenly across all three phases in the network. In many cases, the technicians are required by a utility to carry three different varieties of three-phase meter. Each variety is configured to engage one phase when installed. However, manufacturing three varieties of a three-phase meter may be costly, and carrying these three varieties of a three-phase meter may cause the technician to amass an unwieldy inventory of devices.

In contrast to conventional three-phase energy meters, aspects of the invention include a three-phase selectable energy meter that allows a technician to choose one of three phases of operation during installation. That is, the energy meter described according to aspects of the invention allows for selection between each of the three phases of operation, where in some embodiments, only one phase is selectable at a given time.

As described herein, aspects of the invention include a three-phase selectable energy meter. Turning to FIG. 1, a partial blow-out three-dimensional perspective view of portion of a three-phase selectable energy meter (or, meter) 2 is shown according to embodiments of the invention. As shown, the meter 2 may include a base 4, housing a plurality of elements, including terminal barrels, e.g., a phase A terminal barrel 6, a phase B terminal barrel 8 and a phase C terminal barrel 10 (generally shown, and partially hidden in this view). It should be noted that the terminal barrels 6, 8 and 10 are more clearly visible in FIG. 3 as this perspective view of FIG. 1 obstructs full view of those elements. Description of the individual terminal barrels 6, 8, 10 and base 4 are omitted herein for clarity, as these elements may be substantially similar to conventional elements known in the art.

It is further understood that although embodiments described herein may include individual terminal barrels 6, 8 and 10 housed within (or substantially contained within) the base 4, other embodiments are also contemplated. For example, other embodiments of a three-phase selectable energy meter may have terminals (including, e.g., terminal barrels) housed within a terminal block that is separate from the base. This embodiment may include a conventional terminal block housing terminals separately from the base. It is understood that this embodiment may allow for three-phase selection of terminals as is similarly described herein.

Returning to FIG. 1, also shown in this blow-out view is a terminal bracket 12 configured to couple to the base 4, where the terminal bracket 12 includes a plurality of apertures. In particular, terminal bracket 12 includes a plurality of apertures 14 corresponding to the terminal barrels 6, 8, 10, which may in some embodiments, allow for engagement of one of the terminal barrels 6, 8, 10 from a location above the terminal bracket 12. Also shown is a phase selection member 16, configured to be movably engaged with the base 4, where the phase selection member permits individual selection of each of the phase A terminal barrel 6, the phase B terminal barrel 8 or the phase C terminal barrel 10. As will be explained further with reference to other Figures included herein, the phase selection member 16 may allow for selection of one of the terminal barrels 6, 8 or 10, while prohibiting selection of the other two of the terminal barrels 6, 8 or 10. As shown, in one embodiment, phase selection member 16 may include a conductive strip 18 (including, e.g., a metal), and an actuation member holder 20 including apertures 22 (three shown). In one embodiment, the apertures 22 may respectively correspond to the phase A terminal barrel 6, the phase B terminal barrel 8 and the phase C terminal barrel 10. Also shown is an actuation member 24 (e.g., a screw, pin, elongated block, etc.) configured to actuate one of the terminal barrels 6, 8 or 10 via the phase selection member 16 (and the corresponding apertures 14 of the terminal bracket 12. Also shown in the meter 2 of FIG. 1 are additional conventional components such as a relay 26, and a load control terminal barrel 28. Description of these components is omitted herein for clarity.

Figure 2:
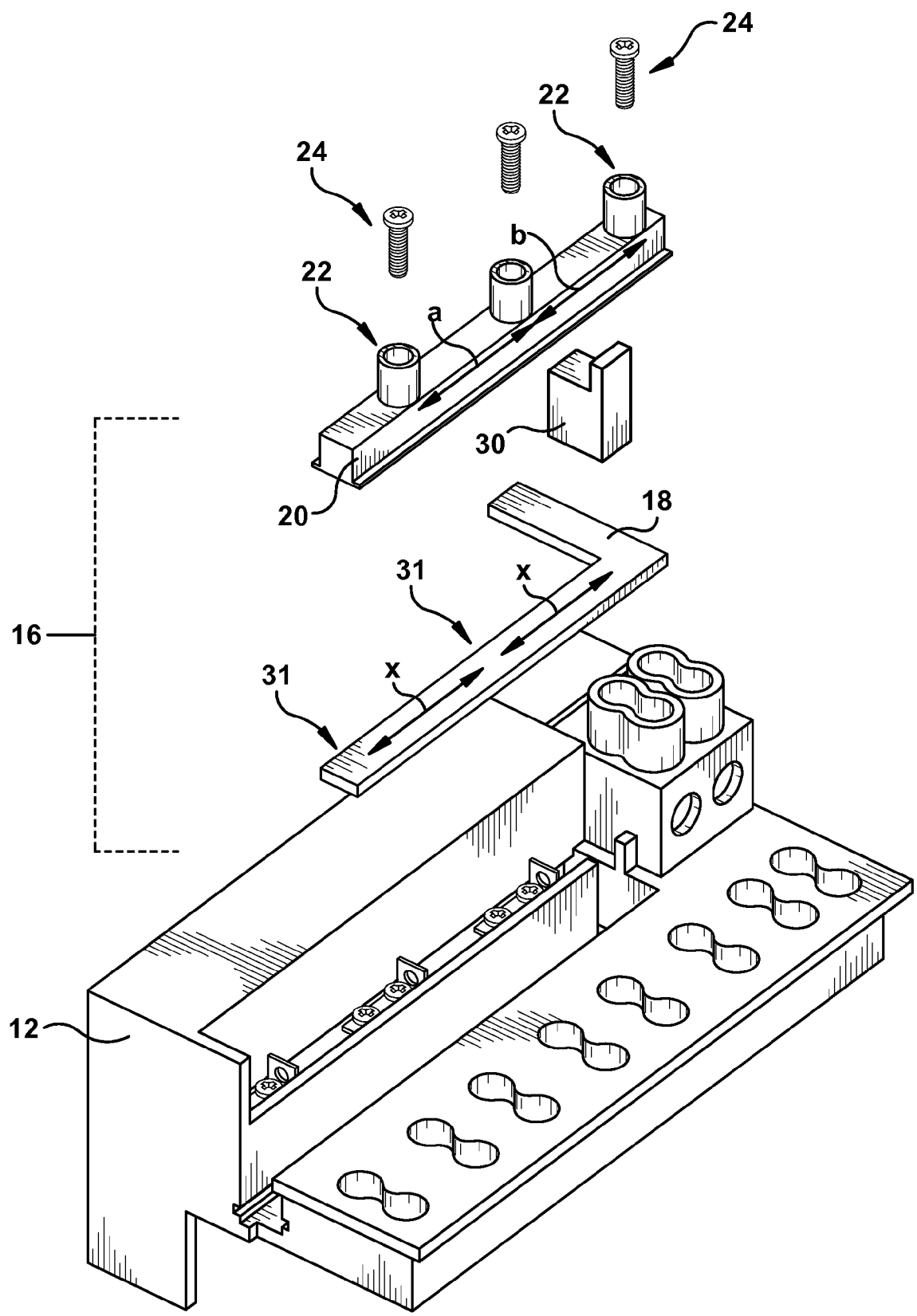
FIG. 2 shows a partial blow-out three-dimensional perspective view of portions of a three-phase selectable energy meter according to embodiments of the invention.

FIG. 2 shows a partial blow-out three-dimensional perspective view of the phase selection member 16, including the conductive strip 18 and the actuation member holder 20, as well as a relay connection member 30, configured to provide electrical connection between the relay 26 (FIG. 1) and one or more of the phase A terminal barrel 6, the phase B terminal barrel 8 and the phase C terminal barrel 10. As shown, three actuation members 24 are illustrated in this blow-out view. It is understood that during operation, the phase selection member 16 may allow only one of the three actuation members 24 to engage one of the terminal barrels 6, 8 or 10 at a given time. That is, selection of one of the terminal barrels 6, 8 or 10 via one of the actuation members 24 may prevent actuation of two of the three actuation member 24 with their corresponding terminal barrels 6, 8 or 10. In one embodiment, this may be accomplished by spacing the apertures 22 in the actuation member holder 20 differently than openings 31 in the conductive strip 18. That is, openings 31 in the conductive strip 18 may correspond directly to the terminal barrels 6, 8, 10, such that openings 31 are equally spaced (e.g., a distance "x" apart) along an axis of the conductive strip 18. In contrast, apertures 22 of the actuation member holder 20 may be spaced a distance "a" and/or "b" apart, where at least one of "a" or "b" is distinct from distance "x." In one embodiment, apertures 22 may be equally spaced along an axis of the actuation member holder 20, where distance "a" equals distance "b." In this case, distances "a" and "b" are distinct from distance "x", such that only one of the apertures 22 may align with one of the openings 31 in the conductive strip 18 at a given time. In another embodiment, apertures 22 may be non-uniformly spaced along the axis of the actuation member holder 20, such that "a" does not equal "b." However, in this case, it is understood that only one of the apertures 22 may align with one of the openings 31 in the conductive strip 18 at a given time. In any case, at least one spacing between the apertures 22 in the actuation member holder 20 may be distinct from at least one spacing between the openings 31 in the conductive strip, such that only one paired aperture 22 and opening 31 may completely receive an actuation member 24 at a given time. This aspect of the invention may prevent accidental engagement of more than one of the phase A terminal barrel 6, the phase B terminal barrel 8 or the phase C terminal barrel 10 at a given time (FIG. 1).

Figure 3:
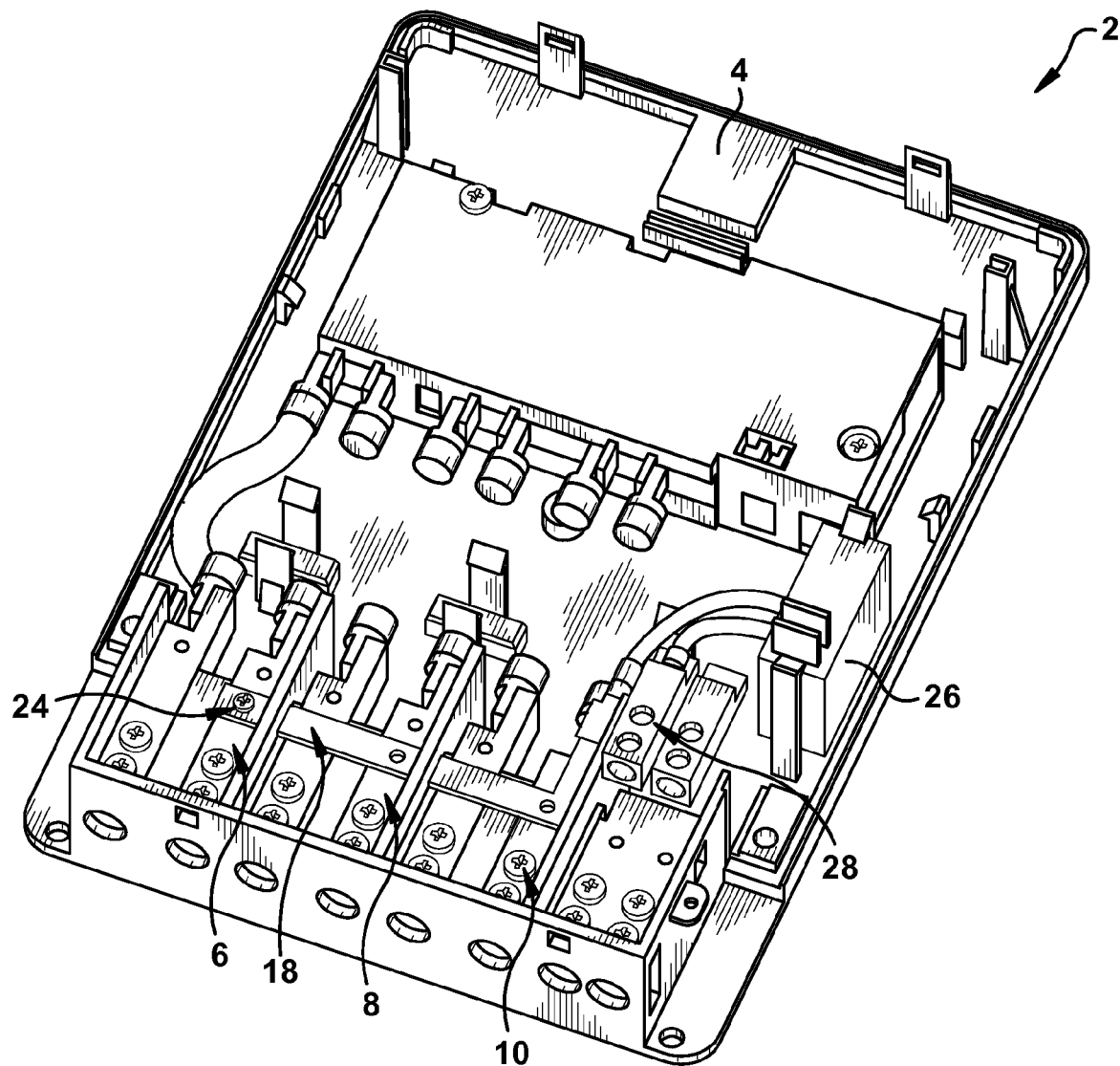
FIG. 3 shows a three-dimensional perspective view of portions of a three-phase selectable energy meter according to embodiments of the invention.

FIG. 3 shows a three-dimensional perspective view of portions of the meter 2 (shown and described in FIG. 1), including the base 4, the terminal barrels 6, 8, 10, the relay 26, and the load control terminal barrel 28. Also shown in the example illustrated in this partial view is the conductive strip 18, electrically connected to the terminal barrel 28 (via, e.g., a conventional electrical conduit) and the phase A terminal barrel 6 via the actuation member 24. While connection with the phase A terminal barrel 6 is shown in this perspective view, it is understood that one of the phase B terminal barrel 8 or the phase C terminal barrel 10 may alternatively be engaged (via a similar actuation member 24). These other scenarios are not specifically illustrated for brevity. It is further understood that in this partial perspective view, the actuation member holder 20 and terminal bracket 12 are omitted.

Figure 4:
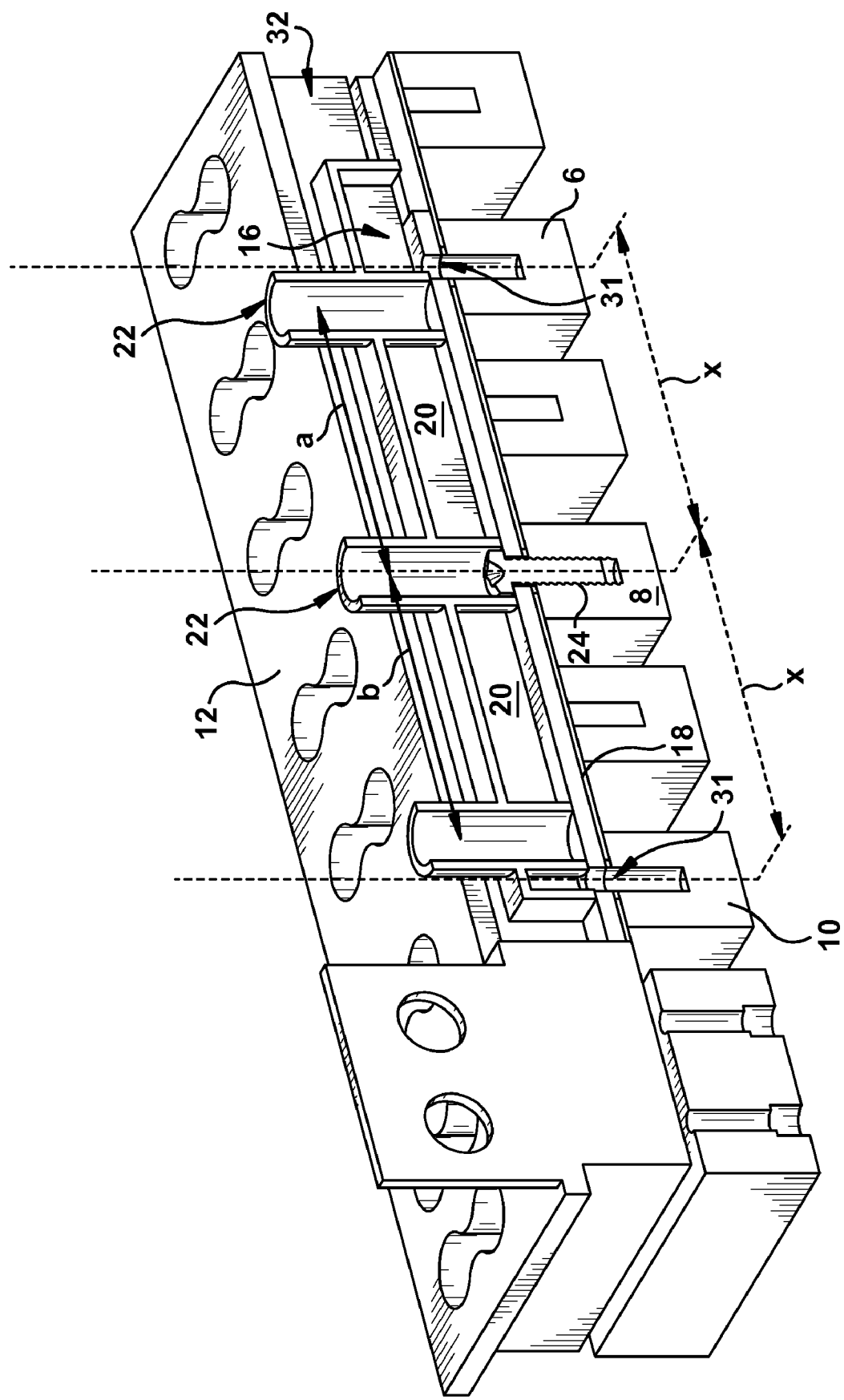
FIG. 4 shows a three-dimensional perspective view of portions of a three-phase selectable energy meter according to embodiments of the invention.

FIG. 4 shows a three-dimensional perspective cut-away view of a terminal bracket 12 connected to the terminal barrels (e.g., phase A terminal barrel 6, phase B terminal barrel 8 and phase C terminal barrel 10). It is understood that terminal bracket 12 and terminal barrels 6, 8, 10 may be substantially similar to those conventional terminal brackets and terminal barrels described herein. Also shown in this cut-away view is the phase selection member 16, including the conductive strip 18 and the actuation member holder 20 operably connected (e.g., slideably connected) to the conductive strip 18. In one embodiment, the actuation member holder 20 may rest within a recess (e.g., a pocket) 32 in the terminal bracket 12. In other embodiments, actuation member holder 20 may be movably (e.g., slideably) engaged with the conductive strip 18 (e.g., via rails, tabs, slideable dovetail matings, rivets, grooves, etc.). In any case, as described with reference to FIG. 2, and as further illustrated in this cut-away view, apertures 22 in the actuation member holder 20 may be mis-aligned with two of the openings 31 in the conductive strip 18, and similarly, mis-aligned with two of the phase A terminal barrel 6, phase B terminal barrel 8 and phase C terminal barrel 10. As shown, an actuation member 24 (e.g., a screw) is only capable of engaging one terminal barrel (e.g., terminal barrel 8 in this depiction) at a time. It is understood that in order to actuate one of the other terminal barrels (e.g., phase A terminal barrel 6 or phase B terminal barrel 10), actuation member 24 may be removed (e.g., vertically) from opening 31 and aperture 22, actuation member holder 20 may be slid relative to the conductive strip such that a distinct aperture 22 aligns with a distinct opening 31, and the actuation member 24 (or another actuation member) may be placed through the distinct aperture 22 (and corresponding distinct opening 31) to actuate the phase A terminal barrel 6 or phase B terminal barrel 10.

Returning to FIG. 1, it is understood that as described herein, the meter 2 including a phase selection member 16 may permit individual selection of one of a plurality of phases (via e.g., the phase A terminal barrel 6, the phase B terminal barrel 8 or the phase C terminal barrel 10) while preventing selection of the other ones of the plurality of phases, thereby allowing a technician (e.g., a human technician) to select only one phase during installation. This may also allow the technician to carry a single three-phase selectable meter (e.g., meter 2) that may be selectively configured as needed (via actuation member(s) 24) for phase selection across all three phases.

It is understood that alternative embodiments of the phase selection member 16 are also possible in keeping with the teachings of aspects of the invention. That is, in some cases, the phase selection member 16 may include an actuation member holder 20 with only two (2) apertures 22 therein, where the actuation member holder 20 may be movably (e.g., slidably) engaged with the conductive strip 18 such that only one of the two apertures 22 may align with one of the openings 31 in the conductive strip 18 at a given time. It is further understood that in another embodiment, actuation member holder 20 may include only one aperture 22 therein, where the actuation member holder 20 may be slidably engaged with the conductive strip 18 such that the aperture 22 may align with one of the openings 31 in the conductive strip 18 at a given time.

In yet another embodiment, a plurality of relays 26 (FIG. 1), e.g., three separate relays 26 may be used to provide the three-phase selectable features described herein. In this case, each phase terminal barrel (e.g., phase A terminal barrel 6, phase B terminal barrel 8 and phase C terminal barrel 10) can be respectively connected to a relay (e.g., relay 26), where each relay (e.g., relay 26) includes or is connected to a control system allowing for selection of one of the phases (via the phase terminal barrels). In one embodiment, control of this type of meter may be performed via a remote system (e.g., a central control center system managed by a utility or service provider), where communication between the meter and the remote system is performed via wireless, hardwire, or any other conventional means. It is understood that in this embodiment the meter may include other conventional components such as: transmitter(s), receiver(s), processor(s), memory, etc., descriptions of which are omitted herein for clarity. In this embodiment, an installer may be able to install the meter (having three relays) without selecting a phase, allowing the control system to dictate phase selection remotely. This may further allow for switching between phases either at the meter itself (e.g., via a user interface) or via the control system. In any case, this embodiment may allow for selection of one of three phases in the electrical meter, thereby reducing an inventory carried by the installer.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A three-phase selectable energy meter comprising:
a base;
a phase A terminal barrel, a phase B terminal barrel and a phase C terminal barrel;
a phase selection member movably engaged with the base, the phase selection member permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel,
wherein the phase selection member includes:
a conductive strip; and
an actuation member holder movably attached to the conductive strip, the actuation member holder including three apertures respectively corresponding to the phase A terminal barrel, the phase B terminal barrel and the phase C terminal barrel; and
a terminal bracket coupled to the base and the phase selection member, the terminal bracket including three apertures respectively corresponding to the phase A terminal barrel, the phase B terminal barrel and the phase C terminal barrel,
wherein the three apertures of the terminal bracket are uniformly separated by a first distance, wherein at least two of the three apertures of the actuation member holder are separated from one another by a second distance distinct from the first distance, wherein one of the three apertures of the actuation member holder is configured to align with one of the three apertures of the terminal bracket, simultaneously mis-aligning two of the three apertures of the actuation member holder with two of the three apertures of the terminal bracket.

2. The three-phase selectable energy meter of claim 1, wherein the individual selection of the one of the phase A terminal barrel, the phase B terminal barrel or the phase C terminal barrel includes actuating the one of the phase A terminal barrel, the phase B terminal barrel or the phase C terminal barrel via the corresponding aperture of the terminal bracket.

3. A three-phase selectable energy meter comprising:
   a base housing a phase A terminal barrel, a phase B terminal barrel and a phase C terminal barrel;
   a phase selection member movably engaged with the base, the phase selection member permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel,
   wherein the phase selection member includes:
      a conductive strip; and
      an actuation member holder configured to hold the actuation member, the actuation member holder movably attached to the conductive strip, the actuation member holder including three apertures respectively corresponding to the phase
   A terminal barrel, the phase B terminal barrel and the phase C terminal barrel;
   an actuation member engaged with the phase selection member and only one of the phase A terminal barrel, the phase B terminal barrel and the phase C terminal barrel; and
   a terminal bracket coupled to the base and the phase selection member, the terminal bracket including three apertures respectively corresponding to the phase A terminal barrel, the phase B terminal barrel and the phase C terminal barrel;
   wherein the three apertures of the terminal bracket are uniformly separated by a first distance, and
   wherein at least two of the three apertures of the actuation member holder are separated from one another by a second distance distinct from the first distance, wherein one of the three apertures of the actuation member holder is configured to align with one of the three apertures of the terminal bracket, simultaneously mis-aligning two of the three apertures of the actuation member holder with two of the three apertures of the terminal bracket.

4. The three-phase selectable energy meter of claim 3, wherein the individual selection of the one of the phase A terminal barrel, the phase B terminal barrel or the phase C terminal barrel includes actuating the one of the phase A terminal barrel, the phase B terminal barrel or the phase C terminal barrel with the actuation member via the corresponding aperture of the terminal bracket.

5. A three-phase selectable energy meter comprising:
   a base housing:
   a phase A terminal barrel, a phase B terminal barrel and a phase C terminal barrel; and
   a relay;
   a phase selection member including a connecting strip electrically connected to the relay, the phase selection member being movably engaged with the base and permitting individual selection of each of the phase A terminal barrel, the phase B terminal barrel and the phase C terminal barrel, wherein the individual selection of the one of the phase A terminal barrel, the phase B terminal barrel or the phase C terminal barrel prohibits selection of the other two of the phase A terminal barrel, the phase B terminal barrel and the phase C terminal barrel,
   wherein the phase selection member includes an actuation member holder movably attached to the connecting strip, the actuation member holder including three apertures respectively corresponding to the phase A terminal barrel, the phase B terminal barrel and the phase C terminal barrel; and
   a terminal bracket coupled to the base and the phase selection member, the terminal bracket including three apertures respectively corresponding to the phase A terminal barrel, the phase B terminal barrel and the phase C terminal barrel;
   wherein the three apertures of the terminal bracket are uniformly separated by a first distance,
   wherein at least two of the three apertures of the actuation member holder are separated from one another by a second distance distinct from the first distance
   wherein one of the three apertures of the actuation member holder is configured to align with one of the three apertures of the terminal bracket, simultaneously mis-aligning two of the three apertures of the actuation member holder with two of the three apertures of the terminal bracket.

6. The three-phase selectable energy meter of claim 5, wherein the individual selection of the one of the phase A terminal barrel, the phase B terminal barrel or the phase C terminal barrel includes actuating the one of the phase A terminal barrel, the phase B terminal barrel or the phase C terminal barrel via the corresponding aperture of the terminal bracket.

* * * * *